(12) United States Patent
Bicking (10) Patent No.: US 6,657,476 B1
(45) Date of Patent: Dec. 2, 2003

(54) AC-COUPLED SENSOR SIGNAL CONDITIONING CIRCUIT

(75) Inventor: Robert E. Bicking, Freeport, IL (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 10/192,455

(22) Filed: Jul. 9, 2002

(51) Int. Cl.[7] .............................. G06G 7/18; G06G 7/19
(52) U.S. Cl. ........................ 327/341; 327/344; 327/510; 327/511
(58) Field of Search .................. 327/344, 345, 327/341, 510, 511; 360/55, 65

(56) References Cited

U.S. PATENT DOCUMENTS

| | | | | |
|---|---|---|---|---|
| 3,553,595 A | * | 1/1971 | Walsh | 327/62 |
| 3,750,146 A | | 7/1973 | Lucas | 341/118 |
| 3,832,536 A | * | 8/1974 | Le Dily et al. | 708/833 |
| 3,836,847 A | | 9/1974 | Lucas | 324/607 |
| 4,450,368 A | | 5/1984 | Spence | 327/89 |
| 4,736,391 A | | 4/1988 | Siegel | 375/317 |
| 4,972,134 A | | 11/1990 | Getz et al. | 318/817 |
| 5,103,080 A | | 4/1992 | Barken | 235/437 |
| 5,166,548 A | | 11/1992 | Nelson | 327/511 |
| 5,262,685 A | | 11/1993 | Demler et al. | 327/91 |
| 5,539,354 A | * | 7/1996 | Carsten | 327/559 |
| 5,841,318 A | * | 11/1998 | Cram | 330/9 |
| 6,229,348 B1 | * | 5/2001 | Matsumoto | 327/67 |
| 6,456,063 B1 | * | 9/2002 | Moreno et al. | 324/207.12 |

FOREIGN PATENT DOCUMENTS

| | | |
|---|---|---|
| JP | 1-198119 | 8/1989 |
| JP | 2-104034 | 4/1990 |
| JP | 4-157915 | 5/1992 |
| JP | 4-265039 | 9/1992 |
| JP | 4-319811 | 11/1992 |
| WO | WO 98/16039 A1 | 10/1996 |

* cited by examiner

Primary Examiner—Tuan T. Lam
(74) Attorney, Agent, or Firm—Kris T. Fredrick (57) ABSTRACT

A method and apparatus for minimizing errors in a sensor device due to signal amplitude variation are disclosed herein. A signal output from the sensor device is amplified and, thereafter, AC-coupled to a comparator such that the amplification and AC-coupling of the signal minimize offset shift-related errors associated with the sensor device. The signal can be coupled to eliminate offset shifts due to component mismatches, calibration, aging and/or temperature associated with the sensor device. An AC-coupled sensor signal conditioning circuit is utilized to amplify the signal through an amplifier and then AC-couple the signal to a comparator.

22 Claims, 3 Drawing Sheets

AC-COUPLED SENSOR SIGNAL CONDITIONING CIRCUIT

TECHNICAL FIELD

The present invention is generally related to signal-conditioning methods and systems. The present invention is also related to magnetic sensor devices, such as Hall sensors and magnetoresistive devices. The present invention is also related to techniques for minimizing errors due to signal amplitude variations in magnetic sensors.

BACKGROUND OF THE INVENTION

Magnetic sensing devices for detecting the presence of a ferromagnetic object in the vicinity of the sensing device are utilized widely in a variety of fields, including automotive applications. Such sensing devices typically utilize a magnetic field and employ sensing components that are capable of detecting variations in the strength of a magnetic field. Magnetic field strength generally can be defined as the magnetomotive force developed by a permanent magnet per the distance in the magnetization direction. As an example, an increase in the strength of a magnetic field, corresponding to a drop in the reluctance of a magnetic circuit, can occur as an object made from a high magnetic permeability material, such as iron, is moved toward the magnet.

Magnetic permeability is generally defined as the ease with which the magnetic lines of force, designated as magnetic flux, can pass through a substance magnetized with a given magnetizing force. Magnetic permeability can be quantitatively expressed as the ratio between the magnetic flux density (i.e., the number or lines of magnetic flux per unit area which are perpendicular to the direction of the flux) produced and the magnetic field strength, or magnetizing force. Because the output signal of a magnetic field sensing device is generally dependent upon the strength of the magnetic field, the output signal can be effective in detecting the distance between the sensing device and an object within the magnetic circuit. The range within which the object can be detected is limited by the flux density, as measured in Gauss or Teslas.

Where it is desired to determine the speed or rotational position of a rotating object, such as a disk mounted on a shaft, the object is typically provided with surface features that project toward the sensing device, such as teeth. The proximity of a tooth to the sensing device will increase the strength of the magnetic field. Accordingly, by monitoring the output of the sensing device, the rotational speed of the disk can be determined by correlating the peaks in the sensor's output with the known number of teeth on the circumference of the disk. Likewise, when the teeth are irregularly spaced in a predetermined pattern, the rotational position of the body can be determined by correlating the peak intervals with the known intervals between the teeth on the disk.

One prominent form of such a sensing device is a Hall effect sensor. A Hall effect sensor relies upon a transverse current flow that occurs in the presence of a magnetic field. The Hall effect sensor is primarily driven by a direct current voltage source tied to electrodes at both ends of the Hall effect sensor, creating a longitudinal current flow through the sensor's body. In the presence of a magnetic field, a transverse current is induced in the sensor, which can be detected by a second pair of electrodes transverse to the first pair. The second pair of electrodes can be connected to a voltmeter to determine the potential created across the surface of the sensor. Transverse current flow increases according to a corresponding increase in the magnetic field's strength.

The Hall effect sensor can be mounted within and perpendicular to a magnetic circuit, which can include a permanent magnet and an exciter. The exciter can be configured as a high magnetic permeability element having projecting surface features, which increases the strength of the magnet's magnetic field as the distance between the surface of the exciter and the permanent magnet is reduced. Typically, the exciter can be configured in the form of a series of spaced teeth separated by slots, such as the teeth on a gear. The exciter generally moves relative to the stationary Hall effect sensor element and, in doing so, changes the reluctance of the magnetic circuit so as to cause the magnetic flux through the Hall effect element to vary in a manner corresponding to the position of the teeth. With the change in magnet flux there occurs the corresponding change in magnet field strength, which increases the transverse current of the Hall effect sensor.

With the increasing sophistication of products, magnetic field sensing devices have also become common in products that rely on electronics in their operation, such as automobile control systems. Common examples of automotive applications are the detection of ignition timing from the engine crankshaft and/or camshaft and the detection of wheel speed for anti-lock braking systems and four-wheel steering systems. For detecting wheel speed, the exciter is typically an exciter wheel mounted inboard from the vehicle's wheel, the exciter wheel being mechanically connected to the wheel so as to rotate with the wheel.

The exciter wheel can be provided with a number of teeth, which typically extend axially from the perimeter of the exciter wheel to an inboard-mounted magnetic field sensor. As noted before, the exciter wheel is generally formed of a high magnetic permeability material, such as iron. As each tooth rotates toward the sensor device, the strength of the magnetic field increases as a result of a decrease in the reluctance of the magnetic circuit. Subsequently, the magnetic circuit reluctance increases and the strength of the magnetic field decreases as the tooth moves away from the sensing device. In the situation where a Hall effect device is utilized, there should be a corresponding peak in the device's potential across the transverse electrodes as each tooth passes near the device.

One type of magnetic sensing device utilized in automotive applications, in particular, is a magnetoresistor. In general, a magnetoresistor has higher sensitivity than a Hall element, which potentially can improve sensor performance. A magnetoresistor is a device whose resistance varies with the strength of the magnetic field applied to the device (magnetoresistance). Generally, the magnetoresistor is a slab of electrically conductive material, such as a metal or a semiconductor.

There are three different physical effects, which can cause magnetoresistance to occur. The first type of magnetoresistance is generally referred to as Anisotropic Magnetoresistance (AMR). This effect occurs in thin ferromagnetic films (on the order of several hundred Angstroms thick). The AMR effect results from deflection of magnetization of the ferromagnetic layer by an applied field, which lowers the resistance. The magnetoresistance effect is approximately 2.5% of the base resistance for permalloy (i.e., a specific alloy of approximately 78% nickel and 22% iron), which is favored because it generally is known to not possess any magneto restrictive properties. The AMR effect generally occurs in response to the in-plane component of the applied magnetic field.

The second type of magnetoresistance is referred to generally as Giant Magnetoresistance (GMR). These materials can be generally arranged in a sandwich configuration of several very thin (e.g., 15 to 25 Angstroms) alternating layers of ferromagnetic material and highly conductive material. The ferrormagnetic layers have alternating magnetization, which is rotated into alignment by an applied field to lower the resistance. The GMR effect is from 5% to 35% of the base resistance, resulting in a substantially larger signal than AMR. GMR typically responds to the in-plane component of the applied magnetic field.

The third type of magnetoresistor can be generally formed as a thin elongated body of a high carrier mobility semiconductor material, such as indium antimonide (InSb) having contacts at its ends. Such a configuration responds to the perpendicular component of the magnetic field and, because current through the slab is deflected by an applied magnetic field and flows diagonally across the slab, the resistance increases, which generally occurs as the result of the geometric magnetoresistance effect. All of these magnetoresistors can be mounted within and perpendicular to a magnetic circuit, which can include a permanent magnet and an exciter. The AMR and GMR materials simply have to be mounted further from the magnet so as to be excited by the horizontal component of the magnetic field. The exciter moves relative to the stationary magnetoresistor element and, in doing so, changes the reluctance of the magnetic circuit so as to cause the magnetic flux through the magnetoresistor element to vary in a manner corresponding to the position of the teeth of the exciter. With the change in magnet flux there occurs the corresponding change in magnet field strength, which increases the resistance of the magnetoresistor. Other types of magnetic sensors that can be utilized in such applications include AMR and GMR magnetic sensors.

Magnetic sensors such as, for example, Hall sensors or magnetoresistive devices, exhibit offset shifts due to component mismatch, calibration, temperature and aging. Additionally, electronics utilized to amplify the sensing element output before converting it to digital form also exhibit these offset shifts. One example of a magnetoresistive sensing element signal conditioning circuit is described and illustrated in U.S. Pat. No. 5,455,510, which is assigned to Honeywell Inc. The magnetoresistive sensing elements are arranged in a bridge configuration and are DC-coupled to a comparator circuit, which has switching points that vary as a function of temperature to compensate for scale factor change with temperature. The present inventor has thus concluded, based on the foregoing, that a need exists for a method and apparatus that can minimize errors due to signal amplitude variations of air gap, speed, temperature and aging in magnetic sensors such as, for example Hall sensors or magnetoresistive sensors.

Figure 2:
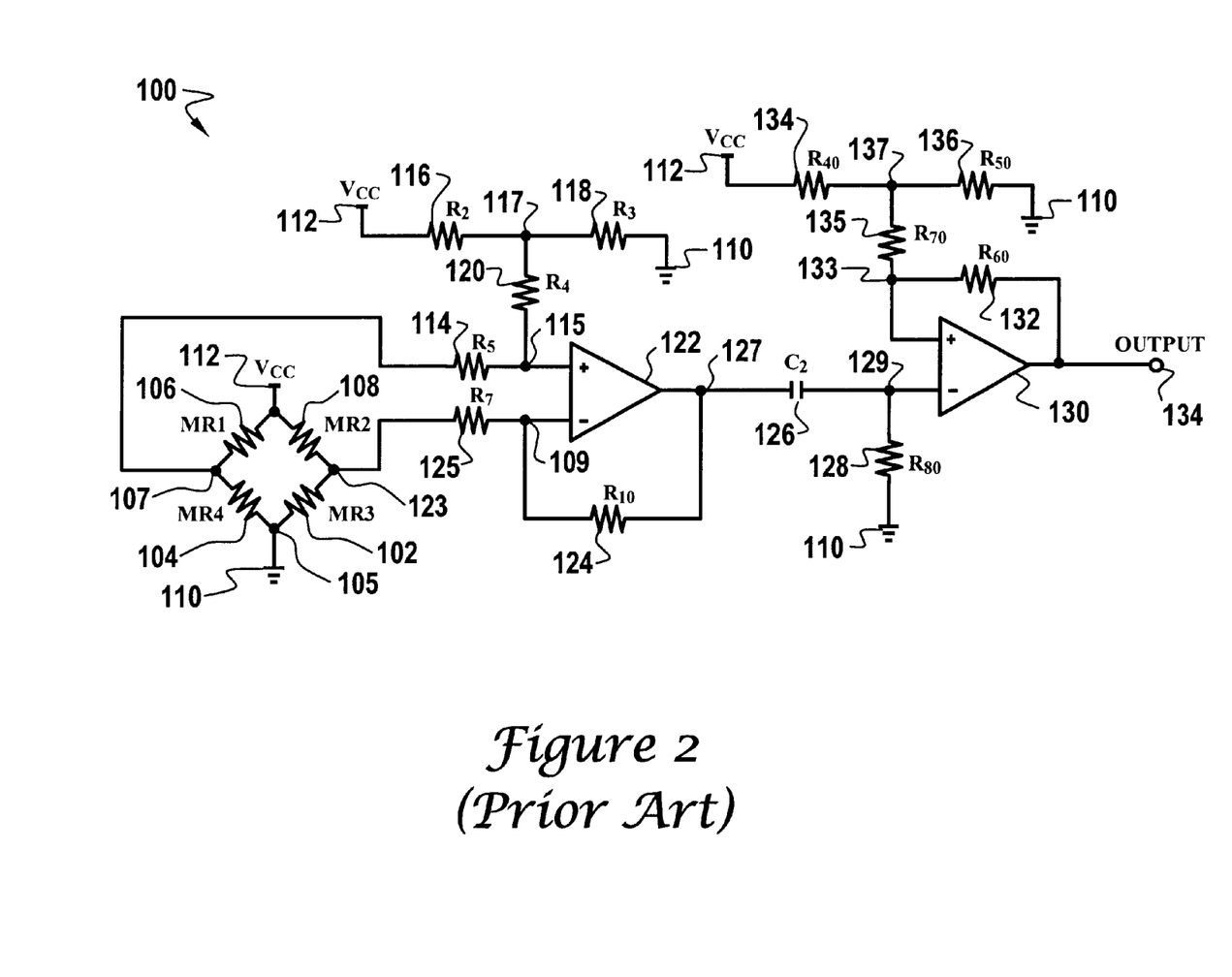
FIG. 2 illustrates a schematic diagram of a prior art AC-coupling circuit.

AC-coupling techniques have been utilized in electronic circuits and sensors to minimize the effects of the aforementioned offset shifts. FIG. 2, for example, illustrated herein, depicts a prior art sensor signal conditioning circuit with a conventional AC-coupling circuit composed of C (capacitance) and R (resistance). The basic AC-coupling or high-pass circuit has appeared in many electronic circuit textbooks over the years. (See "Analysis and Design of Feedback Control Systems", G. J. Thaler and R. G. Brown, McGraw-Hill, 1960, p.231, for example.) Such prior art sensor conditioning circuits have two primary disadvantages. The first disadvantage experienced by sensor signal conditioning circuits, such as the circuit illustrated in FIG. 2, is associated with noise. Noise from a differential amplifier, for example, may be coupled directly into a comparator, thus producing undesirable noise-related problems. The second disadvantage experienced by sensor signal conditioning circuits, such as the circuit depicted in FIG. 2, is related to integrated circuit implementations thereof. If a circuit such as the one illustrated in FIG. 2 is implemented as an integrated circuit, two pins are deemed necessary to make connection to the capacitor (i.e., capacitor C2), making it more susceptible to electromagnetic interference (EMI).

To appreciate the importance of AC-coupling, consider the following example: Assume a sensor output of 3 mv. Assume that the amplifier and comparator both have an input voltage offset of 1 mv and that the amplifier has a gain of 10. For DC coupling, the signal-to-offset ratio is approximately 30:11. For AC-coupling, the signal-to-offset ratio is approximately 30:1, an order-of-magnitude improvement, since the amplifier offset is removed by the AC-coupling. The offset of the comparator is the only remaining error and may be minimized as shown by amplifying the signal before applying it to the comparator. The present invention thus discloses a method and apparatus for accomplishing AC-coupling, which offers several important advantages over prior sensor-conditioning circuits.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide an improved signal-conditioning circuit.

It is, therefore, another aspect of the present invention to provide an AC-coupled sensor signal conditioning circuit.

It is yet another aspect of the present invention to provide a method and apparatus for minimizing errors due to signal amplitude variations in air gap, speed, and temperature associated with magnetic sensors.

The above and other aspects can be achieved as is now described. A method and apparatus for minimizing errors in a sensor device due to signal amplitude variation are disclosed herein.

A signal output from the sensor device is amplified and thereafter AC-coupled to a comparator such that the amplification and AC-coupling of the signal minimize offset shift-related errors associated with the sensor device. The signal can be coupled to eliminate offset shifts due to mismatches, calibration, aging and/or temperature associated with the sensor device. The sensor device comprises, for example, a magnetic sensor, such as a Hall sensor or a magnetoresistive-based sensor. The signal output from the sensor device can be amplified utilizing one or more amplifiers associated with an AC-coupled sensor signal conditioning circuit.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
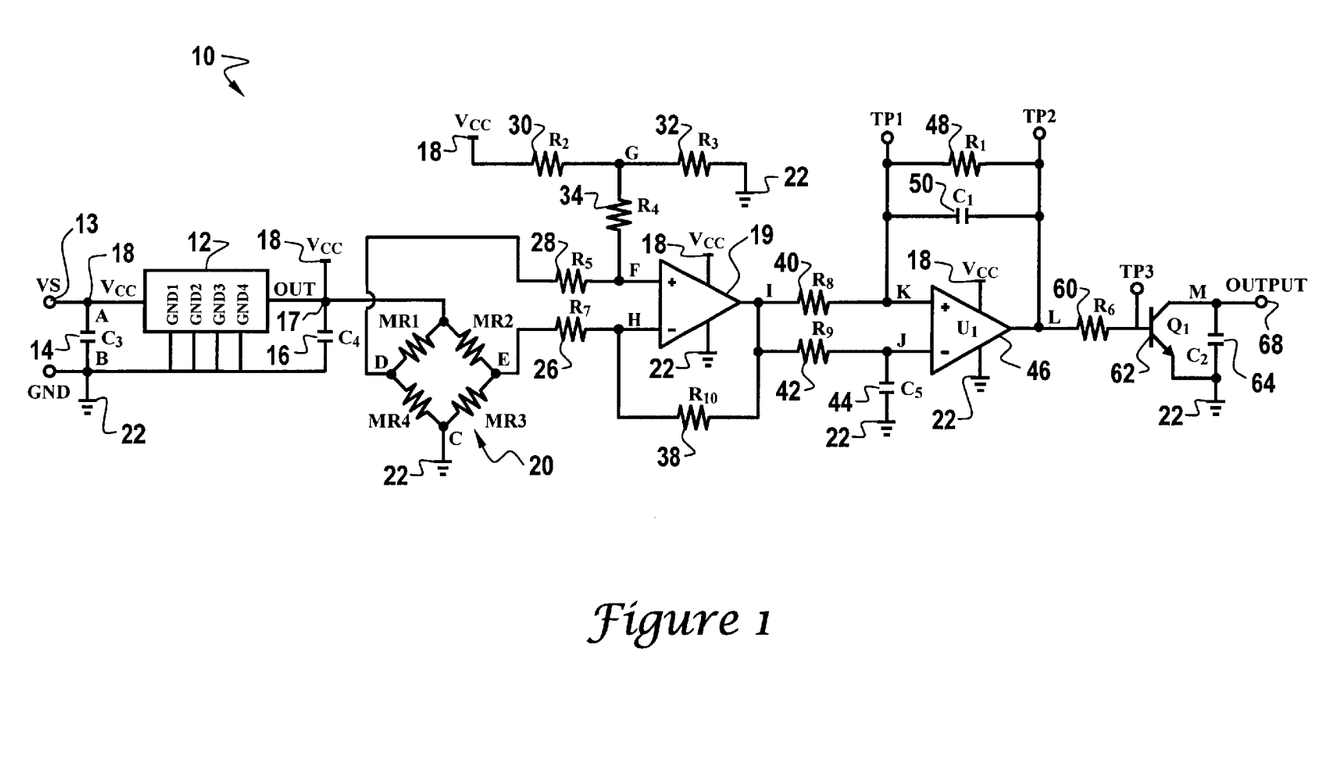
FIG. 1 illustrates a schematic diagram of an AC-coupled sensor signal conditioning circuit that can be implemented in accordance with a preferred embodiment of the present invention.

FIG. 1 illustrates a schematic diagram 10 of an AC-coupled sensor signal conditioning circuit that can be implemented in accordance with a preferred embodiment of the present invention. FIG. 1 includes a capacitor 14 coupled to a power supply 13 at node A and ground 22 at node B. Capacitor 14 is labeled $C_3$ in FIG. 1. A voltage 18 (i.e., $V_{cc}$) is also provided at node A. Additionally, power supply 13 is labeled $V_s$. Similarly, ground 22 is labeled GND. Note that voltages $V_{cc}$ and $V_s$ can electrically comprise the same voltage. Thus, a particular voltage, $V_{cc}$, may be provided by power supply 13 (i.e., voltage $V_s$. In many applications, a power supply, which provides a voltage such as $V_s$, can be configured as an unregulated voltage source, which can vary substantially as a function of load and other operating conditions such as, for example, an automotive storage battery.

Node B is also connected to a unit 12 that includes grounds GND 1, GND 2, GND 3, and GND 4. Unit 12 can generally be implemented as a voltage regulator, which provides a constant voltage from which the circuitry illustrated in FIG. 1 can operate. A capacitor 16, labeled $C_4$, is coupled to node B and power supply 18, which provides voltage $V_{cc}$. Capacitor 16 is also connected to node B and an output 17 of unit 12. A magnetoresistive (MR) bridge circuit 20, which generally includes magnetoresistors $MR_1$, $MR_2$, $MR_3$, and $MR_4$, is coupled to a resistor 28 (i.e., labeled $R_5$) at node D, a resistor 26 (i.e., labeled $R_7$) at node E, and ground 22 at node C. Magnetoresistors $MR_1$ and $MR_2$ are coupled to one another at output 17 of unit 12. Magnetoresistors $MR_1$, $MR_2$, $MR_3$, and $MR_4$ thus generally comprise MR bridge circuit 20. Resistors 28 and 26 are respectively labeled $R_5$ and $R_7$ in FIG. 1. Resistor 28 is further coupled to a resistor 34 at node F.

Resistor 34 is labeled $R_4$ in FIG. 1. Resistor 34 is generally connected to resistors 30 and 32 at node G. Resistor 30, labeled $R_2$, is connected to node G and power supply 18. Resistor 32, labeled $R_3$, is coupled between node G and ground 22. Resistor 34 is also coupled to a positive input of an amplifier 19 at node F. Resistor 26 is connected to a negative input of amplifier 19 at node H. Amplifier 19 is connected to power supply 18 and ground 22. A resistor 38, labeled $R_{10}$, is coupled to node H and a node I. The node I is connected to an output of amplifier 19. Resistor 38 is also coupled to a resistor 40 and a resistor 42 at node I.

Resistors 40 and 42 are respectively labeled $R_8$ and $R_9$ in FIG. 1. Resistor 42 is connected to a capacitor 44 and a negative input of an amplifier 46 at node J. Amplifier 46 is also labeled $U_1$ in FIG. 1. Capacitor 44 is connected to ground 22 and node J. Capacitor 44 is labeled $C_5$ in FIG. 1. Resistor 40 is connected to a positive input of amplifier 46 at node K. Node K is further coupled to a capacitor 50 and a resistor 48. Resistor 48 is labeled $R_1$ and capacitor 50 is labeled $C_1$. Node K is electrically equivalent to node TP1 and node L is electrically equivalent to node TP2. Thus, resistor 48 and capacitor 50 are located in parallel with one another between node TP1 and node TP2, and likewise between node K and node L.

Resistor 48 and capacitor 50 are also connected electrically in parallel with one another. Resistor 48 and capacitor 50 are further coupled to an output of amplifier 46 at node L. Amplifier 46 is also connected to ground 22 and power supply 18. Node L is further connected to a resistor 60, which is labeled $R_6$. Resistor 60 is in turn connected to a transistor 62, which is labeled $Q_1$. A node TP3 is located between resistor 60 and transistor 62 from which a voltage may be read. Transistor 62 is in turn coupled in parallel with a capacitor 64, which is labeled $C_2$. Transistor 62 is additionally connected to ground 22. An output 68 is provided at node M.

Thus, according to FIG. 1, a signal output from a sensor device (e.g., MR bridge circuit 20) can be amplified and thereafter AC-coupled to a comparator, such that the amplification and AC-coupling of the signal minimize offset shift-related errors associated with the sensor device. The signal can be coupled to eliminate offset shifts due to mismatches, calibration, aging and/or temperature associated with the sensor device. The sensor device may comprise, for example, a magnetic sensor, such as a Hall sensor or a magnetoresistive-based sensor. The signal output from the sensor device can be amplified utilizing one or more amplifiers associated with an AC-coupled sensor signal conditioning circuit. The signal may be AC-coupled to the comparator through such an AC-coupled sensor signal conditioning circuit. Note generally that amplifier 19 comprises an integrated circuit (IC) and operates in association with resistors $R_2$ to $R_{10}$ as an amplifier circuit. Amplifier 19 can generally be configured as an op-amp device. A comparator circuit can be formed from a low-pass filter, which is generally configured from resistor $R_9$ and capacitor $C_5$. Such a comparator circuit also includes resistors $R_1$ and $R_8$ and capacitor $C_1$. Resistors $R_2$ to $R_4$ generally provide an offset voltage of Vs/2 to amplifier 19. Capacitor $C_1$ generally filters high frequency noise, which otherwise might affect the operation of the comparator circuit.

In accordance with one implementation of the present invention, a brass board second level sensor can be constructed utilizing 22 mm diameter SS housing having a 0.5 mm face thickness. The signal conditioning electronics illustrated in FIG. 1, can be configured to include a 5 V regulator, a G=10 differential-to-single-ended amplifier and an AC-coupled comparator. Effective hysteresis may be approximately ±0.1 mv. The AC-coupling circuit illustrated in FIG. 1 can utilize a grounded capacitor in a low-pass configuration, which is desirable from an EMI viewpoint as described earlier. Because the low-pass signal can be subtracted from the input signal by the comparator, the result is a high pass transfer function of the form:

$$\frac{V_o}{V_i} = \frac{j\omega RC}{(1 + j\omega RC)}$$

Where $\omega = 2\pi f$.

Where $$f = \frac{1}{2\pi}RC$$

is the break frequency.

The high-pass transfer function described above is generally identical to the transfer function of prior high-pass configuration illustrated in FIG. 2 herein.

For R=100 k and C=1 uF, f=1.6 Hz, which provides a minimum RPM of approximately 15 with a 13-tooth crank target. The signal conditioning electronics illustrated in FIG. 1 can be constructed on a circular PC board utilizing commercial components. The sensors can be potted after assembly. Those skilled in the art can appreciate that the particular values and configurations discussed herein are not considered limiting features of the present invention but represent potential experimental implementations of the present invention. It is anticipated that the method and apparatus disclosed herein may be implemented in a wide variety of products, sensors and applications. The particular values and configurations disclosed herein are discussed for general edification purposes only.

A method and apparatus are thus disclosed herein for minimizing errors due to signal amplitude variations associated with air gap, speed and temperature in magnetic sensors. As explained previously, sensors such as Hall and magnetoresistive devices can exhibit offset shifts due to component mismatch, calibration, temperature and aging. Additionally, electronics utilized to amplify the sensing element output before converting it to digital form can also exhibit these offset shifts. Thus, in accordance with the method and apparatus of the present invention, by amplifying the output signal, and thereafter coupling it to a comparator, all of these errors can be eliminated (except the comparator offset).

An AC-coupled sensor signal conditioning circuit can thus be configured in association with a magnetic sensor to reduce such errors due to signal amplitude variations. Such an AC-coupled sensor signal conditioning circuit generally can include one or more amplifiers for amplifying a signal output from the magnetic sensor. Such an AC-coupled sensor signal conditioning circuit can also include an AC-coupling for AC-coupling the signal to the comparator. The comparator itself can receive the signal through the AC-coupling from the amplifier, such that amplification and AC-coupling of the signal minimizes offset shift-related errors associated with the sensor device. Examples of magnetic sensors that can be implemented in accordance with the method and apparatus of the present invention include automotive gear tooth and ring magnet sensors, to name a few.

FIG. 2 depicts a schematic diagram of a prior art AC-coupling circuit 100. Note that the schematic diagram depicted in FIG. 2 is presented for illustrative and edification purposes only and is not considered a limiting feature of the present invention. AC-coupling circuit 100 generally includes four magnetoresistors 106, 108, 102, and 104, which are respectively labeled $MR_1$, $MR_2$, $MR_3$ and $MR_4$ in FIG. 2. Magnetoresistors 104 (i.e., $MR_4$) and 102 (i.e., $MR_3$) are connected to one another at node 105. Ground 110 is also coupled to node 105. Magnetoresistors 104 and 106 are connected to one another at node 107. Resistor 114, which is labeled $R_5$ in FIG. 2, is coupled to node 107 and a node 115. A positive input (i.e., "+") of an amplifier 122 is also coupled to node 115. A resistor 120, labeled $R_4$ in FIG. 2, is also connected to resistor 114 and the positive input of amplifier 122.

Resistors 116 and 118 are coupled to one another at node 117. Resistor 116 is generally connected to power supply 112.(i.e., $V_{cc}$) and node 117, while resistor 118 is generally connected to node 117 and ground 110. Node 115 is also connected to, a positive input of amplifier 122. A resistor 125 is coupled to a node 123 and a resistor 124 (i.e., $R_{10}$) at a node 109. A negative input of amplifier 122 is also connected to node 109. Resistor 124 is also connected to a node 127, which in turn is coupled to an output of amplifier 122 and a capacitor 126 (i.e., $C_2$).

Capacitor 126 is connected to a resistor 128 (i.e., $R_{80}$) at node 129, which in turn is coupled to a negative input of amplifier 130. Resistor 128 is also coupled to ground 110 and node 129. A positive input of amplifier 130 is connected to a resistor 132 (i.e., $R_{60}$) and a resistor 135 (i.e., $R_{70}$) at node 133. A resistor 136 (i.e., $R_{50}$) is coupled to a resistor 134 (i.e., $R_{40}$) at node 137. Resistor 134 is also coupled to voltage supply 112 (i.e., $V_{cc}$), while resistor 136 is coupled to ground 110. Resistor 132 is connected to node 133 and an output 134 of amplifier 130.

Figure 3:
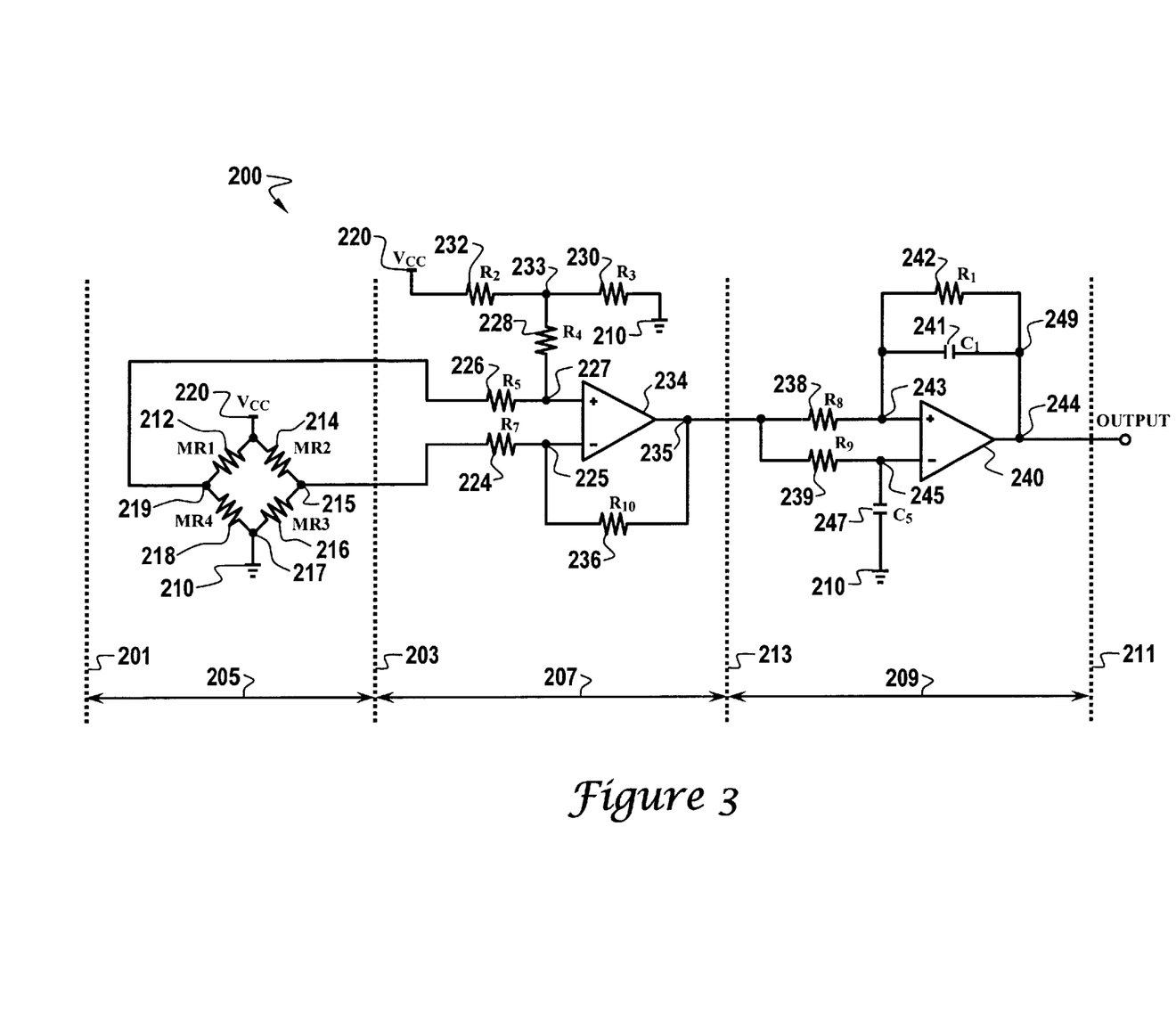
FIG. 3 illustrates a schematic diagram of an improved AC-coupling circuit, in accordance with a preferred embodiment of the present invention.

FIG. 3 illustrates a schematic diagram of an improved AC-coupling circuit 200, in accordance with a preferred embodiment of the present invention. Circuit 200 generally includes an MR bridge circuit composed of magnetoresistors 212, 214, 216, and 218, which are respectively labeled $MR_1$, $MR_2$, $MR_3$, and $MR_4$ in FIG. 3. Magnetoresistors 212 and 214 are coupled to one another at power supply 220 (i.e., $V_{cc}$). Magnetoresistors 214 and 216 are connected to one another at node 215. A resistor 224 (i.e., $R_7$) is coupled between node 215 and a node 225.

Magnetoresistors 218 and 216 are coupled to one another at node 217, which in turn is connected to ground 210. Magnetoresistors 212 and 218 are coupled to one another at node 219. Node 219 in turn is generally connected to a resistor 226 (i.e., $R_5$). Resistor 226 is connected to a node 227, which in turn is connected to a positive input (i.e., "+") of amplifier 234. Resistor 226 is also coupled to a resistor 228 (i.e., $R_4$) at node 227. Thus, resistor 228 is also connected to the positive input of amplifier 234. Resistor 228 is in turn connected to a resistor 232 (i.e., $R_2$) and a resistor 230 (i.e., $R_3$) at a node 233. Resistor 230 is generally coupled between node 233 and ground 210. Resistor 232 is generally coupled between node 233 and power supply 220. A resistor 236 (i.e., $R_{10}$) is generally connected to a negative input of amplifier 234 at node 225. Resistor 236 is further connected to resistor 224 at node 225.

Resistor 236 is also connected to a node 235, which in turn is coupled to a resistor 238 (i.e., $R_8$) and a resistor 239 ($R_1$). Resistor 238 is further coupled to a resistor 242 (i.e., $R_1$), a capacitor 241 (i.e., $C_1$), and a positive input of amplifier 240 at node 243. Resistor 242 is generally configured in parallel with capacitor 241 and is connected to capacitor 241 at node 249 and node 243. Resistor 239 (i.e., $R_9$) is coupled to node 235 and a negative input of amplifier 240 at node 245. Node 245 is in turn connected to a capacitor 247 (i.e., $C_5$), which is further connected to ground 210. An output 244 of amplifier 240 is also coupled to node 249. Nodes 244 and 249 comprise the same electrical node.

As indicated in FIG. 3, capacitors 241 and 247 are connected in a low-pass configuration to an inverting input of amplifier 240. Amplifier 240 thus functions as a comparator. Noise is generally filtered to ground such that only one connection to capacitor 241 is required, because the ground is already required. Based on the foregoing, it can be appreciated that circuit 200 thus generally is configured from three basic circuits, including a magnetoresistive bridge circuit. 205, an amplifier circuit 207, and a comparator 209. Magnetoresistive bridge circuit 205 is generally indicated in FIG. 3 between dashed lines 201 and 203. Amplifier circuit 207 is generally indicated in FIG. 3 between dashed lines 203 and 213, while comparator 209 is generally indicated in FIG. 3 between dashed lines 213 and 211.

Comparator 209 comprises an AC-coupled comparator circuit, while amplifier circuit 207 can be configured as a differential single-ended amplifier circuit. Additionally magnetoresistive bridge circuit 205 can be constructed from a plurality of magnetoresistors 212, 214, 216, and 218 (i.e., respectively MR1, MR2, MR3, and MR4). Thus, magnetoresistive bridge circuit 205 generates an output signal, which is initially amplified utilizing amplifier circuit 207 to produce an amplified signal thereof.

A low-pass signal can then be subtracted from the amplified signal to produce a high-pass signal thereof. Amplifying the output signal produced by magnetoresistive bridge circuit 205 is important because the offset of the magnetoresistive bridge circuit and the amplifier circuit (i.e., and any offset aging or temperature effects thereof) can be removed by AC-coupling via comparator 209, leaving only the offset of comparator 209. Additionally, because the output signal produced by magnetoresistive bridge circuit 205 is amplified before being applied to comparator 209, the effective offset of comparator 209 is reduced by the gain of amplifier circuit 207. Note that magnetoresistors 212, 214, 216 and 218 illustrated in FIG. 3 are generally analogous to magnetoresistors MR1, MR2, MR3, and MR4 depicted in FIG. 1.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive nor to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of the invention in which an exclusive property or right is claimed are defined as follows. Having thus described the invention what is claimed is:

1. A method for minimizing errors in a magnetic sensor device of an AC-coupled sensor signal conditional circuit due to signal amplitude variation, said method comprising the steps of:
   generating a signal output from said magnetic sensor device comprising a magnetoresistive bridge circuit;
   amplifying said signal output through an amplifier circuit of said AC-coupled sensor signal conditioning circuit to produce an amplified signal thereof;
   filtering said amplified signal utilizing a low pass filter of said AC-coupled sensor signal conditioning circuit to produce a high-pass signal thereof; and
   thereafter providing said high-pass signal as input to a comparator coupled to said low pass filter in order to minimize offset shift-related errors associated with said magnetic sensor device, such that an effective offset of said comparator is reduced by a gain of said amplifier circuit.

2. The method of claim 1 wherein said high-pass signal is provided as input to said comparator to eliminate an offset shift due to component mismatches associated with said magnetic sensor device.

3. The method of claim 1 wherein said high-pass signal is provided as input to said comparator to eliminate an offset shift due to a calibration of said magnetic sensor device.

4. The method of claim 1 wherein said high-pass signal is provided as input to said comparator to eliminate an offset shift due to a temperature associated with said magnetic device.

5. The method of claim 1 wherein said high-pass signal is provided as input to said comparator to eliminate an offset shift due to aging of said magnetic sensor device.

6. The method of claim 1 wherein said high-pass signal is provided as input to said comparator in order to minimize offset shift-related errors associated with said magnetic device.

7. The method of claim 1 further comprising the steps of:
   configuring said amplifier circuit as a differential single-ended amplifier circuit comprising at least one op-amp device;
   connecting a first end of a first resistor to said magnetic sensor device and a second end of said first resistor to a negative input of said op-amp device;
   coupling a first end of a second resistor to said negative input of said op-amp device and a second end of said second resistor to an output of said op-amp device, wherein said amplified signal is generated at said output of said op-amp device;
   connecting a first end of a third resistor to said magnetic sensor device and a second end of said third resistor to a positive input of said op-amp device; and
   coupling said positive input of said op amp device to a fourth resistor which is connected to a fifth resistor and a sixth resistor, wherein said fifth resistor is coupled to a power supply and said sixth resistor is coupled to ground.

8. The method of claim 1 further comprising the steps of:
   configuring said magnetoresistive bridge circuit to comprise a plurality of magnetoresistors of said AC-coupled sensor signal conditioning circuit.

9. The method of claim 1 further comprising the step of:
   configuring said comparator to comprise an AC-coupled comparator circuit of said AC-coupled sensor signal conditioning circuit.

10. The method of claim 9 further comprising the steps of:
   configuring said AC-coupled comparator circuit of said AC-coupled sensor signal conditioning circuit to comprise at least one op-amp device;
   connecting a negative input of said op-amp device to a first end of a first capacitor and a second end of a first resistor, wherein said first capacitor further comprises a second end coupled to ground and said first resistor comprises a first end of said first resistor coupled to an output of said amplifier circuit of said AC-coupled sensor signal conditioning circuit;
   coupling a positive input of said op-amp device to a second end of a second resistor, a first end of a third resistor and a first end of a second capacitor, wherein said second resistor includes a first end coupled to an output of said amplifier circuit, said third resistor includes a second coupled to an output of said comparator, and said second capacitor includes a second end coupled to said output of said comparator;

placing said third resistor and said second capacitor in parallel with one another, wherein said third resistor and said second capacitor are connected to one another at an output of said op-amp device.

11. A method for minimizing errors in a magnetic sensor device of an AC-coupled sensor signal conditioning circuit due to signal amplitude variation, said method comprising the steps of:

generating a signal output from said magnetic sensor device comprising a magnetoresistive bridge circuit that includes a plurality of magnetoresistors;

amplifying said signal output through an amplifier circuit of said AC-coupled sensor signal conditioning circuit to produce an amplified signal thereof;

filtering said amplified signal utilizing a low pass filter of said AC-coupled sensor signal conditioning circuit to produce a high-pass signal thereof;

thereafter providing said high-pass signal to a comparator of said AC-coupled sensor signal conditioning circuit, wherein said comparator comprises an AC-coupled comparator circuit that includes at least one op-amp device, such that an effective offset of said comparator is reduced by a gain of said amplifier circuit;

connecting a negative input of said op-amp device to a first end of a first capacitor and a second end of a first resistor, wherein said first capacitor further comprises a second end coupled to ground and said first resistor comprises a first end of said first resistor coupled to an output of said amplifier circuit of said AC-coupled sensor signal conditioning circuit;

coupling a positive input of said op-amp device to a second end of a second resistor, a first end of a third resistor and a first end of a second capacitor, wherein said second resistor includes a first end coupled to an output of said amplifier circuit, said third resistor includes a second coupled to an output of said comparator, and said second capacitor includes a second end coupled to said output of said comparator; and placing said third resistor and said second capacitor in parallel with one another, wherein said third resistor and said second capacitor are connected to one another at an output of said op-amp device, thereby minimizing offset shift-related errors associated with said magnetic sensor device, including calibration, temperature, and aging effects thereof.

12. An apparatus for minimizing errors in a magnetic sensor device of an AC-coupled sensor signal conditioning circuit due to signal amplitude variation, said apparatus comprising:

said magnetic sensor device comprising a magnetoresistive bridge circuit from which a signal output is generated;

an amplifier circuit, which receives as input said signal output from said magnetic sensor device to produce an amplified signal thereof;

a low pass filter of said AC-coupled sensor signal conditioning circuit for filtering said amplified signal to produce a high-pass signal thereof; and wherein said high-pass signal is provided as an input to a comparator coupled to said low pass filter in order to minimize offset shift-related errors associated with said magnetic sensor device, such that an effective offset of said comparator is reduced by a gain of said amplifier circuit.

13. The apparatus of claim 12 wherein said high-pass signal is AC-coupled to said comparator to eliminate an offset shift due to component mismatches associated with said magnetic sensor device.

14. The apparatus of claim 12 wherein said high-pass signal is AC-coupled to said comparator to eliminate an offset shift due to a calibration of said magnetic sensor device.

15. The apparatus of claim 12 wherein said high-pass signal is AC-coupled to said comparator to eliminate an offset shift due to a temperature associated with said magnetic sensor device.

16. The apparatus of claim 12 wherein said high-pass signal is AC-coupled to said comparator to eliminate an offset shift due to aging of said magnetic sensor device.

17. The apparatus of claim 12 wherein said high-pass signal is AC-coupled to said comparator, such that amplification and AC-coupling of said output signal minimizes offset shift-related errors associated with said magnetic sensor device.

18. The apparatus of claim 12 further comprising:

said amplifier circuit comprising a differential single-ended amplifier circuit that includes at least one op-amp device;

a first end of a first resistor connected to said magnetic sensor device and a second end (of said first resistor to a negative input of said at least one op-amp device;

a first end of a second resistor connected to said negative input of said at least one op-amp device and a second end of said second resistor to an output of said at least one op-amp device, wherein said amplified signal is generated at said output of said at least one op-amp device;

a first end of a third resistor connected to said magnetic sensor device and a second end of said third resistor to a positive input of said at least one op-amp device; and said positive input of said op amp device coupled to a fourth resistor connected to a fifth resistor and a sixth resistor, wherein said fifth resistor is coupled to a power supply and said sixth resistor is coupled to ground.

19. The apparatus of claim 12 wherein said magnetoresistive bridge circuit of said AC-coupled sensor signal conditioning circuit comprises a plurality of magnetoresistors.

20. The apparatus of claim 12 wherein said comparator of said AC-coupled sensor signal conditioning circuit comprises an AC-coupled comparator circuit.

21. The apparatus of claim 20 further comprising:

said AC-coupled comparator circuit comprising at least one op-amp device;

a negative input of said op-amp device connected to a first end of a first capacitor and a second end of a first resistor, wherein said first capacitor further comprises a second end coupled to ground and said first resistor comprises a first end of said first resistor coupled to an output of said amplifier circuit of said AC-coupled sensor signal conditioning circuit;

a positive input of said op-amp device coupled to a second end of a second resistor, a first end of a third resistor and a first end of a second capacitor, wherein said second resistor includes a first end coupled to an output of said amplifier circuit, said third resistor includes a second coupled to an output of said comparator, and said second capacitor includes a second end coupled to said output of said comparator; and said third resistor and said second capacitor configured in parallel with one another, wherein said third resistor and said second capacitor are connected to one another at an output of said at least one op-amp device.

22. An apparatus for minimizing errors in a magnetic sensor device of an AC-coupled sensor signal conditioning circuit due to signal amplitude variation, said apparatus comprising:

said magnetic sensor device a magnetoresistive bridge circuit that generates a signal output, wherein said magnetoresistive bridge circuit comprises a plurality of magnetoresistors;

an amplifier circuit of said AC-coupled sensor signal conditioning circuit wherein said amplifier circuit, receives as input said signal output from said magnetic sensor device to produce an amplified signal thereof;

a low pass filter of said AC-coupled sensor signal conditioning circuit, wherein said low pass filter filters said amplified signal to produce a high-pass signal thereof;

an AC-coupling for AC-coupling said high-pass signal to a comparator, wherein said comparator comprises an AC-coupled comparator circuit that includes at least one op-amp device, such that an effective offset of said comparator is reduced by a gain of said amplifier circuit;

a negative input of said op-amp device connected to a first end of a first capacitor and a second end of a first resistor, wherein said first capacitor further comprises a second end coupled to ground and said first resistor comprises a first end of said first resistor coupled to an output of said amplifier circuit of said AC-coupled sensor signal conditioning circuit;

a positive input of said op-amp device coupled to a second end of a second resistor, a first end of a third resistor and a first end of a second capacitor, wherein said second resistor includes a first end coupled to an output of said amplifier circuit, said third resistor includes a second coupled to an output of said comparator, and said second capacitor includes a second end coupled to said output of said comparator; and said third resistor and said second capacitor configured in parallel with one another, wherein said third resistor and said second capacitor are connected to one another at an output of said at least one op-amp device, thereby minimizing offset shift-related errors associated with said magnetic sensor device, including calibration, temperature, and aging effects thereof.

* * * * *